United States Patent
Fonseca et al.

(12)

(10) Patent No.: US 6,777,147 B1
(45) Date of Patent: Aug. 17, 2004

(54) METHOD FOR EVALUATING THE EFFECTS OF MULTIPLE EXPOSURE PROCESSES IN LITHOGRAPHY

(75) Inventors: Carlos A. Fonseca, Staten Island, NY (US); Scott J. Bukofsky, Hopewell Junction, NY (US); Kafai Lai, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,944

(22) Filed: May 21, 2003

(51) Int. Cl.[7] .................................................. G03F 9/00
(52) U.S. Cl. ........................... 430/30; 430/312; 716/21
(58) Field of Search ...................... 430/30, 312; 716/21

(56) References Cited

U.S. PATENT DOCUMENTS

| | | |
|---|---|---|
| 5,527,645 A | 6/1996 | Pati et al. |
| 5,532,090 A | 7/1996 | Borodovsky |
| 5,635,316 A | 6/1997 | Dao |
| 5,807,649 A | 9/1998 | Liebmann et al. |
| 5,830,611 A | 11/1998 | Bishop et al. |
| 5,965,306 A | 10/1999 | Mansfield et al. |
| 6,027,842 A | 2/2000 | Ausschnitt et al. |
| 6,049,660 A | 4/2000 | Ahn et al. |
| 6,159,644 A | 12/2000 | Satoh et al. |
| 6,187,486 B1 | 2/2001 | Lai et al. |
| 6,429,667 B1 | 8/2002 | Ausschnitt et al. |
| 6,523,165 B2 | 2/2003 | Liu et al. |
| 2002/0076629 A1 | 6/2002 | Miwa et al. |
| 2002/0091986 A1 | 7/2002 | Ferguson et al. |

FOREIGN PATENT DOCUMENTS

DE          10046652          3/2001

OTHER PUBLICATIONS

Peng et al., "Direct interfermetric phase measurement using an aerial image measurement system," Mar. 15–18, 1999, Proceedings of the SPIE—The International Society for Optical Engineering Conference, vol. 3677, pt. 1–2, pp. 734–739 (Abstract).

Brunner et al., "Simple models for resist processing effects," Jun., 1996, Solid State Technology, vol. 39, No. 6, pp. 95–103 (Abstract).

*Primary Examiner*—Christopher G. Young
(74) *Attorney, Agent, or Firm*—Todd M. C. Li

(57) ABSTRACT

A method of evaluating process effects of multiple exposure photolithographic processes by first determining a set of expected images for each exposure step or process of the multiple exposure process individually and then obtaining a composite set of images by sequentially perturbing images from a first or previous exposure step by weighted images from the subsequent exposure step. Preferably, the expected images are determined by simulation in the form of normalized aerial images over a range of defocus for each exposure step, and the weighting factor used is the dose-ratio of the subsequent exposure dose to the prior step exposure dose. The resulting composite set of images may be used to evaluate multiple exposure processes, for example, to provide an estimate of yield for a given budget of dose and focus errors, or alternatively, to provide specifications for tool error budgets required to obtain a target yield.

20 Claims, 11 Drawing Sheets

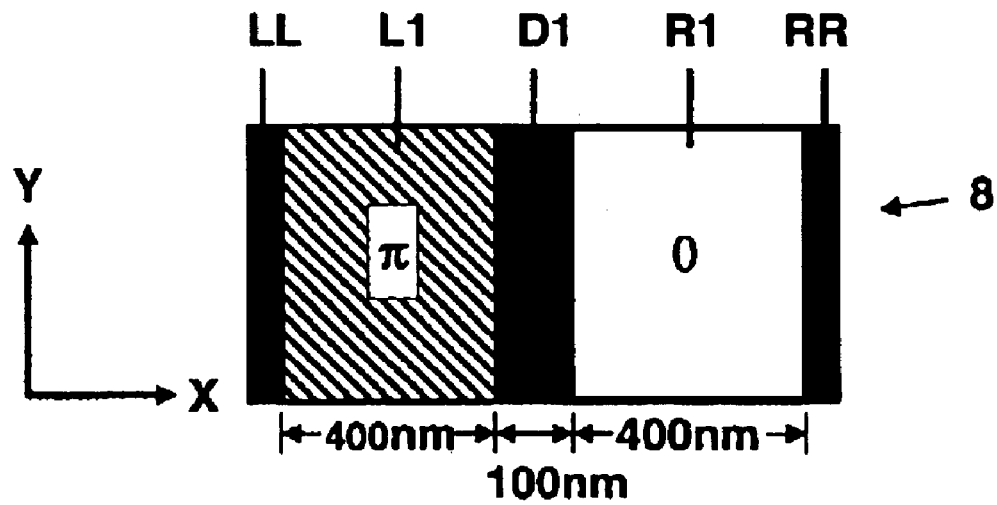
PRIOR ART FIG.1A
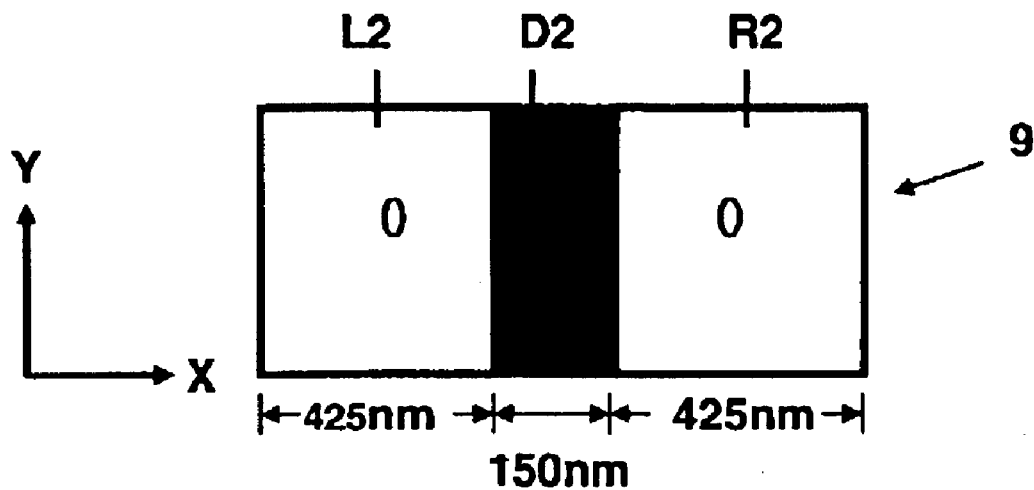
PRIOR ART FIG.1B

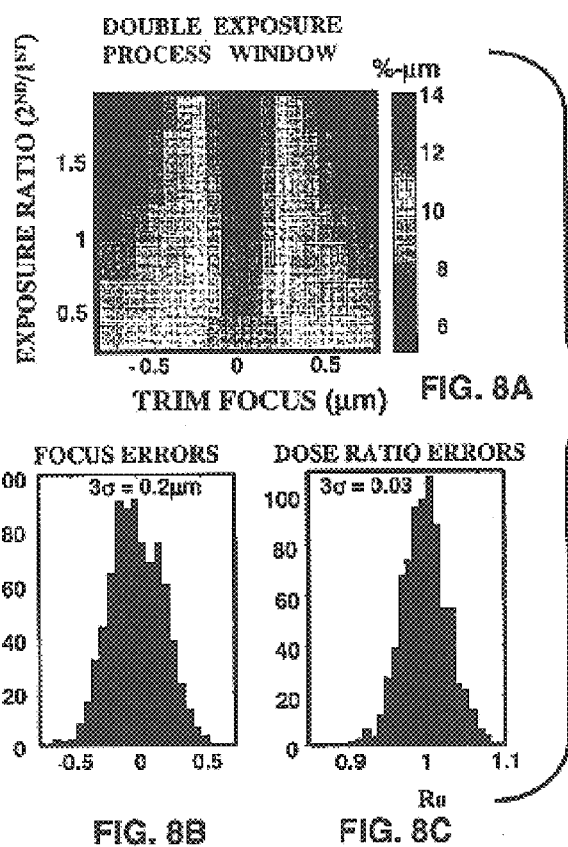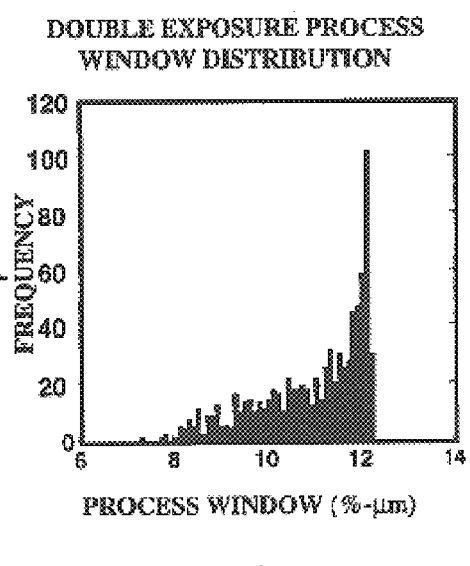
FIG. 8A
FIG. 8B
FIG. 8C
FIG. 8D

METHOD FOR EVALUATING THE EFFECTS OF MULTIPLE EXPOSURE PROCESSES IN LITHOGRAPHY

BACKGROUND OF INVENTION

This invention relates to photolithographic processing methods and more particularly to calculating process effects of multiple exposure techniques therefor.

Typically, a device such as a MOSFET chip is formed on a semiconductor wafer by formation of several layers of material. Most of those layers formed are manufactured using photographic patterning techniques, e.g. photolithography, to expose a target on the device to form a pattern in a photosensitive medium. During the manufacturing process, a pattern for each of the layers on the device is printed with a single exposure of a photosensitive medium (photoresist layer) on the target to form a photolithographic mask as a result of the exposure of the photosensitive layer (photoresist layer) followed by development thereof.

It is well known how to calculate or predict effects of process errors from a single exposure technique for the exposure of photosensitive layer, e.g. photoresist for that purpose. The calculation in a simulation of such effects is commonly known as the process latitude or process window for a process such as a lithographic process which is expressed by the equation described next.

Process Window Expression for a Single Exposure System

The simulated Process Window PW for a single exposure system is defined by the equation as follows:

$$PW = AE \Box_{pw}(FEM, E, F)$$

Where the parameters are:
FEM=linewidth vs. focus and dose curves,
E=the exposure dose variation associated with FEM analysis,
F=Focus variation associated with FEM, and
$f_{pw}$=the commonly known process window.

Process window refers to the range of lithographic process conditions (e.g. defocus and exposure dose) within which critical mask pattern features will have printed dimensions that are within a desired tolerance range.

A problem arises when more than one exposure technique is being explored as a viable option for printing critical lithographic levels.

For example, one technique that can require a double exposure is the implementation of the Alternating Phase-Shift Mask (altPSM) method, wherein as a first step an altPSM mask, such as the exemplary altPSM mask 8 shown in FIG. 1A is used by passing radiation therethrough to expose a target on a photosensitive layer. Then follows the second step of exposing the target with radiation passed through a Trim mask such as the exemplary Trim mask 9 shown in FIG. 1B. The Trim mask exposure is employed to trim out and/or remove unwanted features of the photosensitive layer (photoresist or resist), leaving only the desired patterns in the photosensitive layer (photoresist) on the device (chip/wafer) to form the final desired image.

The exemplary altPSM mask 8 shown in FIG. 1A, which is 1000 nm wide, has an opaque narrow margin LL on the left and a mirror image opaque narrow margin RR on the right. In FIG. 1A, the margins LL/RR, which manifestly block the passage of radiation therethrough, are 50 nm wide. There is a central opaque divider D1 midway between the narrow margins LL/RR which is 100 nm wide, which also manifestly blocks the passage of radiation therethrough. On the right and left of the central opaque divider D1, between the margins LL/RR are left/right portions L1/R1 of the altPSM mask each of which is 400 nm wide. The right portion R1 of the altPSM mask passes radiation therethrough with a phase shift of zero degrees (0 Å°). The left portion L1 of the altPSM mask passes radiation therethrough with a phase shift of Ï□(180 Å°). A first exposure is created from the altPSM mask of FIG. 1A.

The exemplary Trim Mask 9 shown in FIG. 1B, which is also 1000 nm wide, has no opaque margins. In this case there is a wider central opaque divider D2 midway between the edges, if the Trim mask 9 is 150 nm wide. On the right and left of the central opaque divider D2, between the edges of the trim mask 9 are left/right portions L2/R2 of the Trim mask 9, each of which is 425 nm wide.

By providing a second exposure of the photoresist on the target device through the Trim mask 9 of FIG. 1B, the effect of the first exposure on the target device is affected (modified). While it is well known how to calculate or predict the effects of process errors with single exposure techniques, it is difficult to calculate or predict the composite effects of process errors in double exposure schemes, as the second exposure parameters are largely independent from the first.

Several patents which have dealt with multiple exposure techniques but which differ substantially from the present invention are described below.

U.S. Pat. No. 5,527,645 of Pati et al. for 'Systematic Method for Production of Phase-Shifting Photolithographic Masks" describes a method of producing a photolithographic mask with a transmission function in which light is transmitted through non-opaque portions of a mask positioned in an object plane and in which an image is formed on an image plane. Definition of a binary image pattern to be formed by the illumination system on the image plane is followed by generating a continuous mask function of continuously-varying phase which satisfies predetermined error criteria based on the transmission function and the binary image pattern. Then the mask function is transformed into a quadrature-phase mask function by dividing the continuously-varying phase into four phase levels. Next, the Pati patent generates a mask in accordance with the quadrature- phase mask function, wherein the mask includes a plurality of pixel regions each of which has a transmittance corresponding to one of the four phase levels. The Pati patent describes a method of fabricating an altPSM mask, but it does not describe a way of analyzing or predicting the final printed patters on a wafer.

U.S. Pat. No. 5,807,649 Liebmann et al. for "Lithographic Patterning Method and Mask Set Therefor with Light Field Trim Mask" which is commonly assigned describes a lithographic patterning method and mask set using a phase shift trim mask having mask dimensions increased in block size so as to remove previous exposure defects. There is no discussion of the process effects on the final critical resist pattern on a wafer.

U.S. Pat. No. 5,532,090 Borodovsky for 'Method and Apparatus for Enhanced Contact and Via Lithography" describes a method and apparatus for forming openings in a photosensitive layer. An unpatterned photosensitive layer is exposed to a first mask having an opening pattern with dimensions within tight process tolerances. Before development, the photosensitive layer is exposed to a second mask with a grid of clear spaces around the opening pattern. The combined exposure through the two masks forms a latent image with a smaller opening. Using two exposures, with the exposure dose for each designed to control the intensity profile, a reduced dimension opening is formed. The Borodovsky patent describes a technique for forming small holes in resist, but does not relate to methods of calculation/quantifying of process effects upon final resist patterns.

U.S. Pat. No. 5,635,316 of Dao for 'Layout Methodology, Mask Set, and Patterning Method for Phase-shifting Lithography" describes a device layer layout method for patterning a photosensitive layer. Device features are placed on lines running in rows and/or columns during layout. The lines and/or columns are extracted from the database to produce a layout of the phase-edge phase shifting layer. The photosensitive layer may be exposed to a mask that corresponds to that layout, producing a latent image of the rows and/or lines. The photosensitive layer is also exposed to the device layer layout to expose unwanted portions of the phase-edge layer. Dao et al. describes an application for multiple exposures which does not relate to a method of calculating process effects.

U.S. Pat. No. 6,159,644 of Satoh et al. for 'Method of Fabricating Semiconductor Circuit Devices Utilizing Multiple Exposures" describes a method of making such devices which enhances an alignment at the time of making the devices using an exposure method employing a mixed use of a reduction image projection exposure with ultraviolet rays and an E-beam drawing method. Beam alignment errors are measured. The E-beam draws an exposure with exposure data on the electron beam corrected by the first and second error quantities. This patent does not describe any process effects on the final circuit devices.

Thus, there remains a need for a method to compute a composite process window for multiple exposure lithographic processes.

SUMMARY OF INVENTION

It is an object of this invention to provide a method for evaluating multiple exposure (or multiple step) lithographic processes.

It is a further object of this invention to provide a method for determining composite images for a multiple exposure lithographic process.

It is a further object of this invention to provide a method for determining a composite process window for a multiple exposure lithographic process, where the process window (PW) is the range of lithographic process conditions (e.g. range of exposure dose and defocus conditions) under which one can print a feature reliably.

It is yet a further object of this invention to provide a method for determining an expected yield for a multiple exposure lithographic process when an error budget (i.e., a distribution of dose and defocus errors) is provided for the lithographic process tools and conditions.

It is still yet a further object of this invention to provide a method for determining specifications for tools and processes (e.g. error budget specifications) to ensure a target yield for a multiple exposure lithographic process.

In accordance with this invention, a method of determining a set of composite aerial images for a multiple exposure or multiple step lithographic process by determining sets of aerial images for each exposure step or process individually, and then sequentially determining sets of composite aerial images by combining images from the first or prior exposure step (or process) with a weighted image from subsequent exposure or step of the multiple exposure process.

Preferably, the images are determined by simulation, and are provided as normalized images over a range of defocus values expected for each exposure step. The weighting factor is preferably a ratio of doses of the dose from the subsequent step to the dose from the prior step.

In accordance with the present invention, the composite images may be used to perform a process window analysis of the multiple exposure process. For example, threshold doses for photoresist materials may be provided, and used to determine expected printed critical dimensions (CD). The CD values can in turn be used to determine a representation or function (i.e. a model) for a process window metric, for example, by providing process window metric values at given dose and focus values, similar to a focus-exposure matrix (FEM), and then providing a functional fit to those values, or alternatively, providing a look-up table. This process window metric function may then be used to determine a process window distribution for given error budgets for dose and defocus and provide an expected yield for the multiple exposure process. Alternatively, given a target yield, the composite process window distribution may be used to determine error budget specifications for tools to ensure a target yield is obtained for the multiple exposure process.

BRIEF DESCRIPTION OF DRAWINGS

The foregoing and other aspects and advantages of this invention are explained and described below with reference to the accompanying drawings, in which:

FIG. 1A shows a prior art altPSM mask.

FIG. 1B shows a prior art Trim mask.

FIG. 4A shows the aerial images resulting from the altPSM mask of FIG. 1A, similar to the set of aerial images shown in FIG. 2A, reduced in scale.

FIG. 4B shows a single aerial image (IMAGE2) selected from the aerial images resulting from the Trim mask shown in FIG. 2B. The IMAGE2 curve is merely exemplary of the fact that any one of the several curves in FIG. 2B could be used in the process flow, as outlined herein, of this invention.

FIG. 4C is a composite aerial image of a double exposure from FIG. 4A and FIG. 4B with a particular aerial image HC being selected.

FIG. 4D is a graph illustrating an intensity vs. position curve HC which was selected from the group of curves shown in FIG. 4C, which is being sliced from dose threshold value $t_1$ to threshold value $t_n$, as indicated by the horizontal dotted lines.

FIGS. 8A–8D illustrate the Monte Carlo analysis to provide a composite process window distribution for given dose and defocus error budgets in accordance with this invention.

DETAILED DESCRIPTION

This invention provides a simulation method for calculating and/or predicting effects of process errors (e.g., focus and dose) of techniques of multiple exposure of a layer of a photosensitive material such as a photoresist layer on a substrate.

As indicated above, one technique that can require a double exposure is the implementation of an altPSM process described above with reference to FIG. 1A and FIG. 1B. An example of another multiple exposure process is a first exposure of a pattern is followed by a subsequent exposure after a shift in alignment of the pattern. Although an altPSM multiple exposure process is used below as an example for the purposes of illustrating a preferred embodiment of the present invention, the present invention may be applied to other multiple exposure processes, as will be understood by those skilled in the art.

In a typical altPSM process, the final wafer pattern will be formed by first exposing a resist layer on the wafer to an image formed by exposure (i.e. passing radiation) through altPSM mask 8. The first exposure conditions will be characterized by particular exposure dose and defocus values. After developing the resist to form the first pattern resulting from exposing mask 8, radiation is passed through the Trim mask 9 of FIG. 1B to expose the target on the patterned resist layer, but typically using exposure conditions (e.g. second exposure dose and defocus values) that are different from the dose and defocus values used in the (first) altPSM mask 8 exposure. The expected aerial images resulting from each exposure individually can be simulated using techniques known in the art.

Figure 2A:
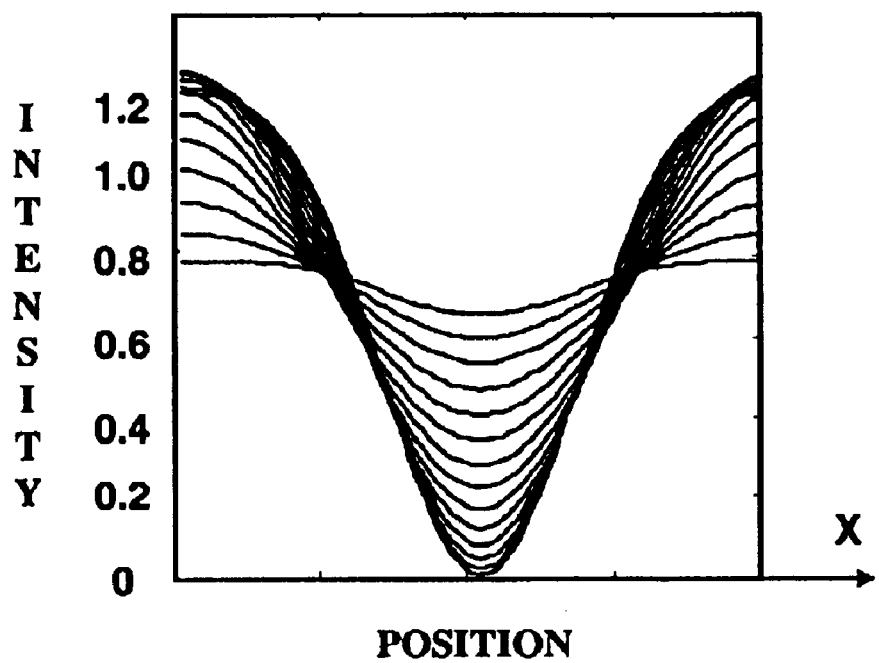
FIG. 2A shows a set of defocused aerial images resulting from the altPSM mask of FIG. 1A.

For example, FIG. 2A shows a set of simulated aerial images produced by projecting illumination through the altPSM mask 8 of FIG. 1A to generate a series of defocused images referred to at a series of different focal points (i.e. defocus values) which are associated with expected process conditions for mask 8. The set of defocused curves shown in FIG. 2A, which are referred to collectively below as "SET1." Each curve illustrates, for different defocus values associated with the first exposure conditions for mask 8, the resulting image intensity projected onto the photoresist of the exposure as a function of position (along the x axis as shown in FIG. 1A). The intensities are normalized to the maximum illumination intensity for a clear mask (or no mask).

Figure 2B:
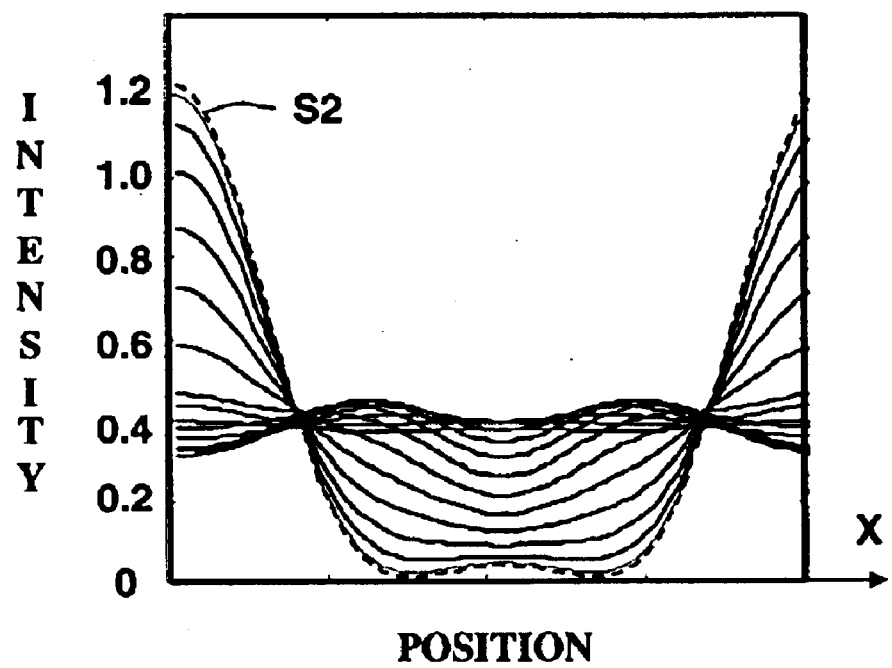
FIG. 2B shows a set of defocused aerial images resulting from the Trim mask of FIG. 1B.

FIG. 2B shows a simulated set of aerial images (normalized to the maximum illumination intensity for a clear mask) produced by projecting illumination through the Trim mask 9 of FIG. 1B to generate a series of defocused images at a series of different focal points. The set of curves shown in FIG. 2B, which are referred to below as "SET2," illustrate, for a range of defocus values associated with the process conditions for Trim mask 9, the resulting normalized image intensity projected onto the photoresist of the exposure as a function of position along the x axis as shown in FIG. 1B. (The uppermost curve is the dashed line curve S2 which is also shown as a solid line curve in FIG. 4B.)

Although the normalized intensity curves shown in FIGS. 2A and 2B are independent of dose, the effect of dose at given defocus value can be estimated since the exposure dose (which is a function of illumination intensity and exposure time) forms a latent image in the resist when the radiation energy exceeds a threshold level. The threshold energy level can be represented by an effective intensity level, for example $t_1$ or $t_n$ as illustrated in FIG. 4D, corresponding to a threshold dose for a given resist. The distance between the intersection points of the threshold level with a given intensity curve provides a measurement of the printed dimension (often referred to as a critical dimension or CD) expected for a given defocus and exposure dose. Thus, the curves in FIG. 2A can be used to estimate CD errors relative to a target CD value as a function of dose and defocus, or process window, for the first (altPSM) mask 8 alone. Likewise, the curves in FIG. 2B can be used to estimate process window for the second (Trim) mask 9 alone.

However, by providing the second (double) exposure of the photosensitive layer through the second, Trim mask 9 of FIG. 1B, the effect of the first exposure (for example, using the altPSM mask 8) upon the photosensitive layer is changed by the double exposure. Thus, the present invention provides a method for computing a composite process window after both, or other multiple exposure processes have been applied.

Figure 3:
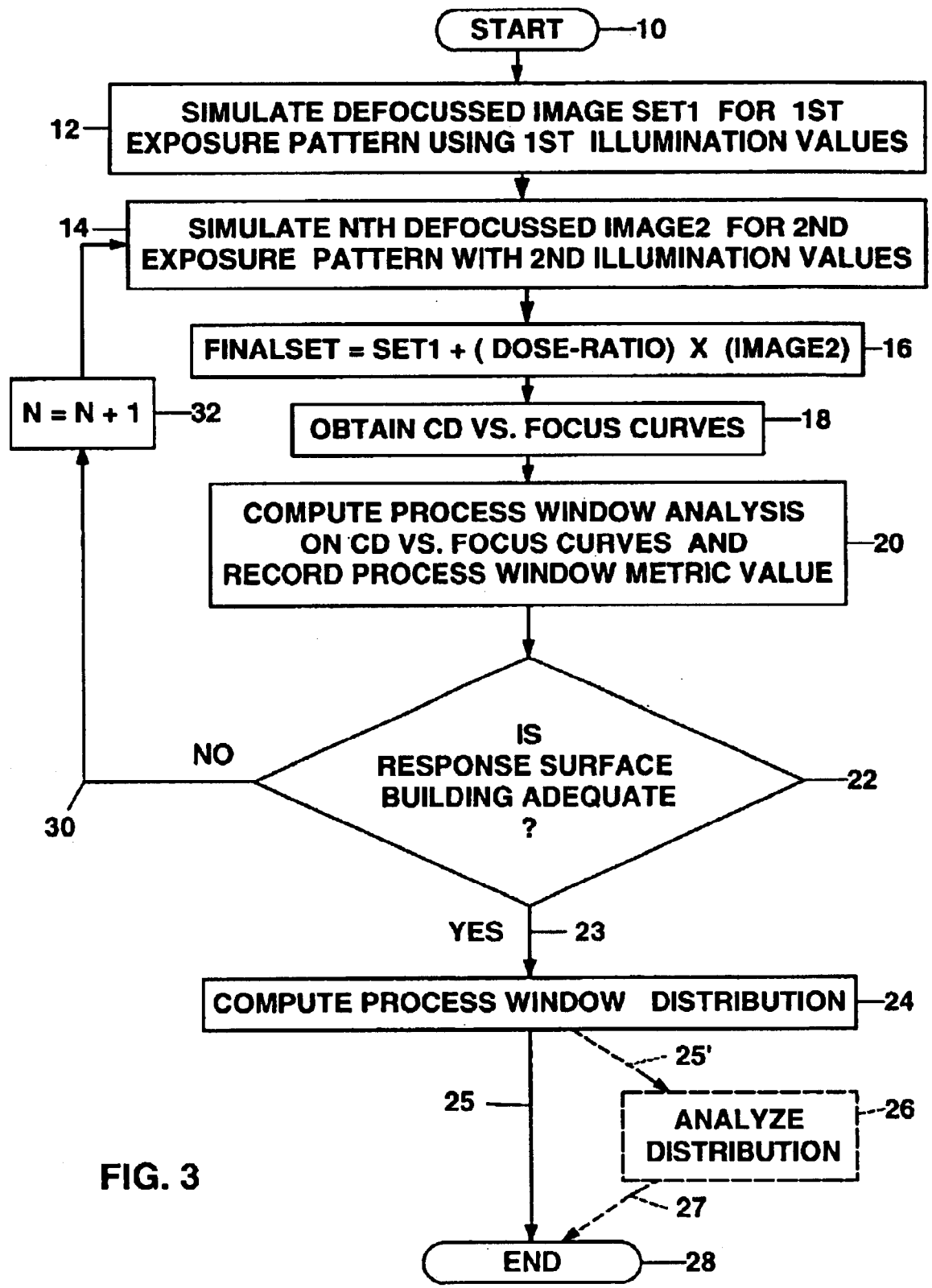
FIG. 3 shows a flow chart of the method of this invention.

FIG. 3 is a flowchart which illustrates the steps performed in accordance with this invention which are employed for calculating and predicting the effects of process errors in double exposure schemes where the second exposure is independent from the first. It would be straight forward to apply the method in accordance with the present invention for other multiple (e.g. more than two) exposure processes.

Steps for predicting a double exposure process window distribution.

The flow chart shown in FIG. 3 is based upon the assumption of use of at least a double exposure process, a given mask design (pattern), and some given illumination conditions for the two (double) exposures or more exposures. The principles of the invention can be extrapolated to use for computing the process window for multiple exposures more than double exposures. The method of the flow chart shown in FIG. 3 starts at block 10.

Figure 9:
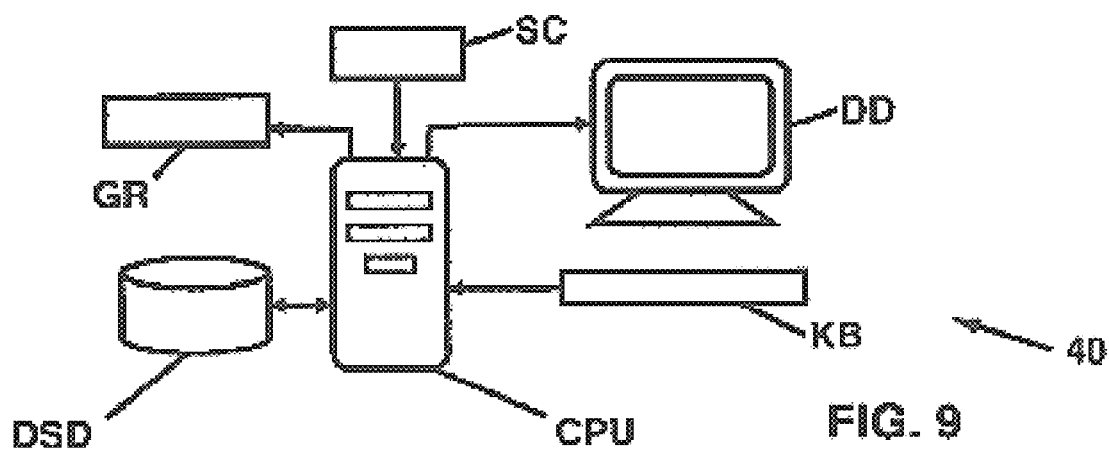
FIG. 9 shows a data processing system adapted for performing the method of this invention.

FIG. 9 illustrates a data processing system 40 for performing the method of the flow chart shown in FIG. 3. A central processor CPU is connected to receive input data from a keyboard KB operated by an operator controlling the process of this invention. Data which has been stored pertaining to the shapes of the masks of FIGS. 1A and 1B and the algorithms associated with this invention are stored in the data storage device DSD which is connected to the processor CPU to send and receive data reciprocally thereto and therefrom. A display device (monitor) DD is connected to display patterns from the processor CPU on the screen thereof and a graphics printing/plotting device GR is provided to provide printed copies of plots displayed on the monitor DD. An optical scanner SC capable of scanning documents is connected to enter graphic and alphanumeric data into the system 40 by a connection to the processor CPU.

I. Determining a Composite Image
Simulation of Aerial Images for First Exposure at Varying Defocus (SET1)

Figure 4A:
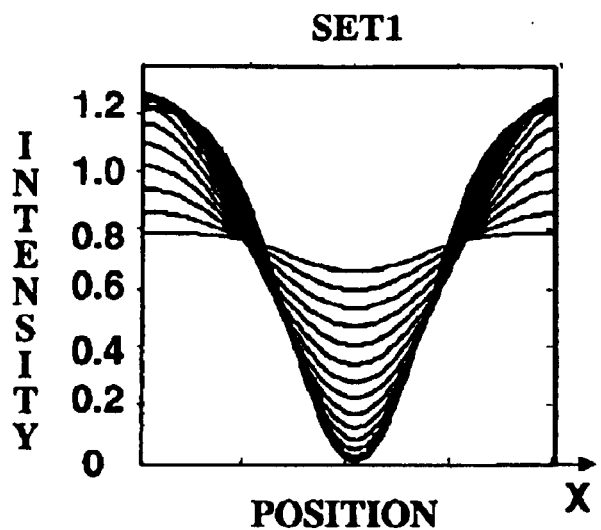
FIGS. 4A–4D illustrate aerial images used in accordance with the present invention to evaluate a multiple exposure process.
Figure 4B:
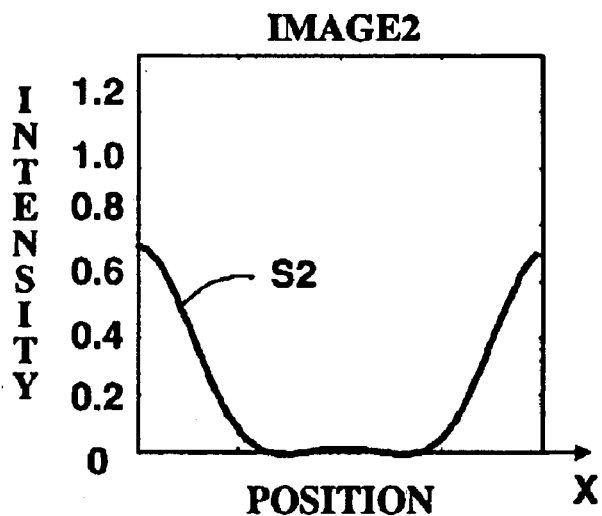

Referring again to FIG. 3, in step 12 the system simulates the set of defocused aerial normalized images SET1 (i.e., a set of aerial images IMAGE1$_i$, i=1, . . . , I, for the first exposure of a multiple exposure process normalized to a maximum intensity corresponding to the first exposure process) which are illustrated by both FIG. 2A and also in FIG. 4A. In this example, FIG. 2A and FIG. 4A show the set of defocused aerial images SET1 which are the exposure images created by using the altPSM mask 8 of FIG. 1A. The curves of SET1 were produced by projecting illumination through the altPSM mask 8 of FIG. 1A with varying degrees of defocus, i.e. the SET1 curves depict the intensity profile through images from the altPSM mask 8 at a series of different focal points of the projection system. Both FIG. 2A and FIG. 4A show the curve of the intensity of the exposure as a function of position (along the x axis) passing through altPSM mask 8 of FIG. 1A. FIG. 4A is a reduced scale reproduction of FIG. 2A included to show the relationship between the exposures represented by the curves of FIGS. 4A and 4B to the exposures represented by the curves of FIG. 4C. The defocus values, f1$_i$, i=1, . . . , I, for defocused images SET1 should be chosen so as to span the range of defocus values that encompass the range of useable CD. For example, in order for the CD to be deemed useable, the image must printed feature should have edges or sidewalls that are sufficiently sharp, and dimensions that fall within a tolerance, such as 10%, of a desired or target CD value. Stated another way, the range of focus values f1$_1$ to f1$_I$ should at least cover those values for which adequate image contrast (or image slope) is obtained so that the printed CD will be useable.

The detailed description of steps 14–28 of FIG. 3 follows next.

Simulation of Aerial Images for Second Exposure at Varying Defocus (SET2)

In step 14, the system of this exemplary embodiment simulates a jth defocused image IMAGE2$_j$, where j=1, . . . , J, and f2$_j$ and f2$_J$ span the range of defocus values such that all expected variations in CD are encompassed for the second exposure pattern. For example, a selected jth image is the dotted line curve S2, selected from the SET2 images shown in FIG. 2B. The same image is shown as the solid line S2 in FIG. 4B based on the patterns generated by illumination through the trim mask 9 of FIG. 1B. As in the simulation of images for the first exposure (SET1), the second exposure images of SET2 (the set of second exposure images IMAGE2$_j$, j=1, . . . , J) are normalized to the maximum intensity for a clear mask at a given focus (or defocus) value for the second exposure process. Note that the maximum intensity for the first exposure step or process may be different than the maximum intensity for the second exposure step, since the illumination conditions may be different for the different exposure steps in a multiple exposure process.

Determining Composite Images (FINALSET)

In accordance with the present invention, a composite image is determined by combining a first simulated image (e.g., an ith selected image IMAGE1$_i$) resulting from a first exposure process (e.g. an exposure of altPSM mask 8) with a second simulated image (e.g., a jth selected image IMAGE2$_j$) resulting from a second exposure process (e.g., and exposure of Trim mask 9). Preferably, a set of composite images IMAGEC$_m$ is formed where m=1, . . . , M, represents a range of dose and defocus values such that all expected variations in CD will be encompassed for the multiple exposure process. This set of composite images is referred to hereinafter as the "FINALSET" of composite images.

Each individual image element of FINALSET is computed by taking each image from SET1 (IMAGE1$_i$ for i=1, . . . , I) at the ith defocus value for the first exposure process and combining it with a weighted jth image IMAGE2$_j$ from SET2 (IMAGE2$_j$ for j=1, . . . , J) at the jth defocus value for the second exposure process. Here, the weighting factor is preferably a normalized ratio of the dose of the second exposure process to the dose of the first exposure process (hereinafter, DOSE-RATIO). In this example, the normalized DOSE-RATIO may be expressed as $$\text{DOSE-RATIO} = D_{norm2}/D_{norm1}.$$

where $D_{norm} = D_A/E_0$,
and $D_A$ is actual dose and $E_0$ is the dose-to-clear (or dose-to-gel) associated with the resist, and the subscripts 1 and 2 refers to the first and second exposure conditions, respectively. Dose-to-clear is defined as the exposure which results in a complete removal of a photoresist layer (for the case of a positive resist) when exposed to developer solution. (For a negative resist, which is initially completely soluble prior to exposure, the corresponding term is dose-to-gel, which is the exposure which is the exposure at which the resist starts to become insoluble.) If a best, or target dose can be defined that would be optimal for each exposure (i.e., $D_{T1}$ and $D_{T2}$), then typically the actual dose will deviate from the optimal target (i.e., a dose error ↑▫$_1$, ↑▫$_2$ respectively) so that DOSE-RATIO may be expressed as:

$$\text{DOSE-RATIO} = ((D_{T2} + \uparrow\square_2)/E_{02})/((D_{T1} + \uparrow\square_1)/E_{01}).$$

For convenience in simulation, DOSE-RATIO may also be expressed in terms of a target or optimal dose ratio for the combined dual exposures $R_0$, and actual dose ratio $R_A$ may be expressed as a deviation ↑▫ from the optimal $R_0$, i e.:

$$R_{Am} = R_0 + \uparrow\square_m.$$

Preferably, the range of dose ratio errors, ↑▫$_m$, where m=1, . . . , M, spans the range of dose-ratio errors expected for the dual exposure process.

Thus, in step 16, one composite, or perturbed, image IMAGEC (i.e., one composite image element or entry of FINALSET) is determined by adding the weighted image intensity of the IMAGE2 curve S2$_j$ (where j ranges through J defocus values F2$_j$ for the second exposure step) of step 14 (FIG. 4B) to each one of the image intensities IMAGE1$_i$ (where i ranges through I defocus values F1$_i$ for the first exposure step) from SET1 shown in FIG. 4A as indicated by the following expression:

$$\text{IMAGEC}_{i,j,m} = \text{IMAGE1}_i + \{R_{Am} \times \text{IMAGE2}_j\},$$

where the mth dose-ratios $R_{Am}$ are chosen where m=1, . . . , M, spans the range of dose-ratio errors expected for the dual exposure process. For each subsequent exposure step of a multiple process, the dose-ratio for the next process step relative to the previous process step $R_{n+1,n}$ is the ratio of the (n+1)th dose to the $R_{n'n-1}$ dose ratio, and $R_{n+1'n}$ is applied sequentially to the (n+1)th IMAGE$_{n+1}$.

In the present dual-exposure example, if J=4 number of second defocus values F2$_j$ and M=5 number of dose-ratio values are deemed adequate to sample the range of variation for this example dual-exposure process, then N=J×M=20 values (Block 32 of FIG. 3) of $\{R_{Am} \times \text{IMAGE2}_j\}$ are derived for each ith IMAGE1$_i$ (i.e. for all F1$_i$, for i=1 through I) from SET1, as illustrated in Table I below.

TABLE I

Second Exposure

| Number (N = J × M) | 2nd Exposure Dose (Dose-Ratio) | 2nd Exposure Focus |
|---|---|---|
| 1 | 1 | 1 |
| 2 | 2 | 1 |
| 3 | 3 | 1 |
| 4 | 4 | 1 |
| 5 | 5 | 1 |
| 6 | 1 | 2 |
| 7 | 2 | 2 |
| 8 | 3 | 2 |
| 9 | 4 | 2 |
| 10 | 5 | 2 |
| ... | ... | ... |
| 20 | 5 | 4 |

Each composite image $IMAGEC_{i,j,m}$ in the FINALSET of image curves can be used to obtain expected width or critical dimension (CD) values as a function of threshold dose values. Deviations of these CD values from nominal or target design values can then be used to estimate the composite process window, as described in more detail below.

II. Determining a Composite Process Window

The quality of a lithographic process may be expressed in terms of a metric for appropriate characteristics of the image patterns or resist patterns. For example, variations in linewidth or CD, resist thickness after develop, or sidewall angle of resist features are some characteristics or metrics that may be used. If these characteristics, such as CD variation, fall within an acceptable tolerance when the process conditions varying (e.g. in the presence of dose and defocus variations), then to ensure the desired yield is obtained, the process conditions should preferably be controlled to vary within this acceptable range or window of process conditions.

A standard method of measuring process window is to use a focus-exposure matrix (FEM), in which experimental data, such as CD variation, is obtained for a test pattern processed through a range of dose and focus conditions.

In accordance with the present invention, an composite focus-exposure matrix (FEM) is generated by using the composite image set (FINALSET), and then a composite process window may be estimated for a multiple exposure process by analysis of the composite FEM, as described in more detail below.

Critical Dimension (CD) vs. 1st Defocus Curves

In accordance with the present invention, the composite images (FINALSET) can be used to estimate resist pattern characteristics (e.g. a composite FEM) for use in process window analysis. For example, in step 18 of FIG. 3, CD values at a given second exposure defocus and a given dose-ratio (or a given second exposure dose) can be estimated for all of the SET1 images (i.e. at all 1st exposure defocus values). The estimated CD value could be a threshold CD value, which is the CD that would be obtained for an ideal resist in which the resist responds as a step function when an applied image intensity reaches the threshold dose of the resist. Alternatively, it is possible to simulate the expected CD or other pattern feature characteristics (such as side wall angle or resist thickness) by using a more realistic resist model, in which the FINALSET composite images are provided as input into the model.

Figure 4C:
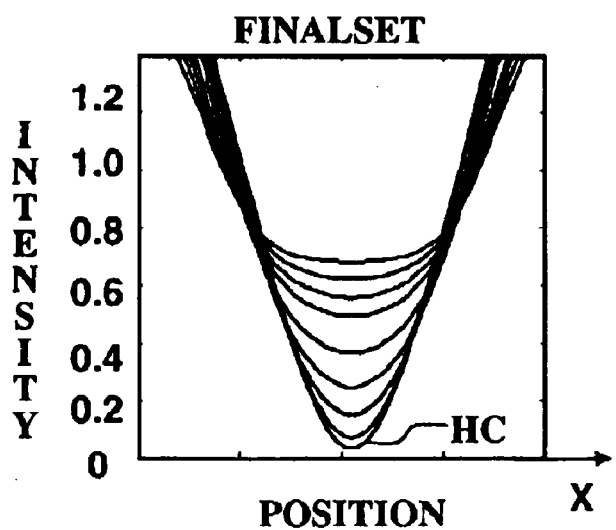
Figure 4D:
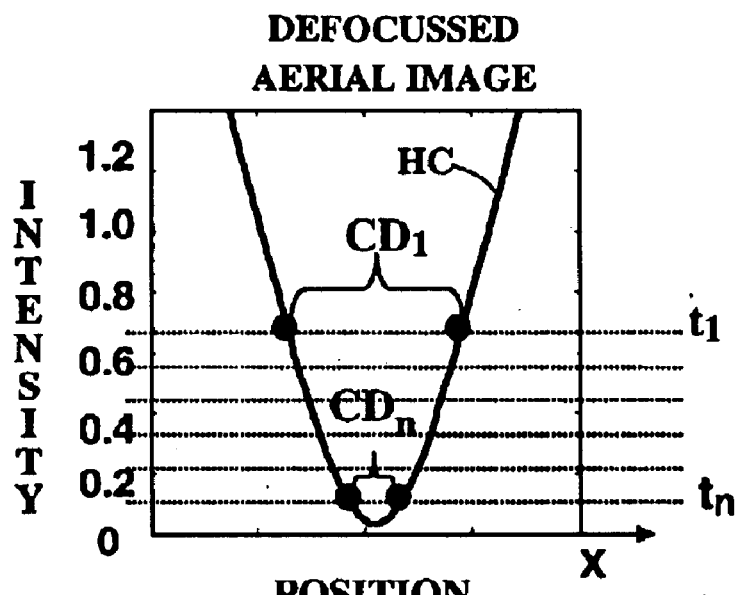
Figure 5A:
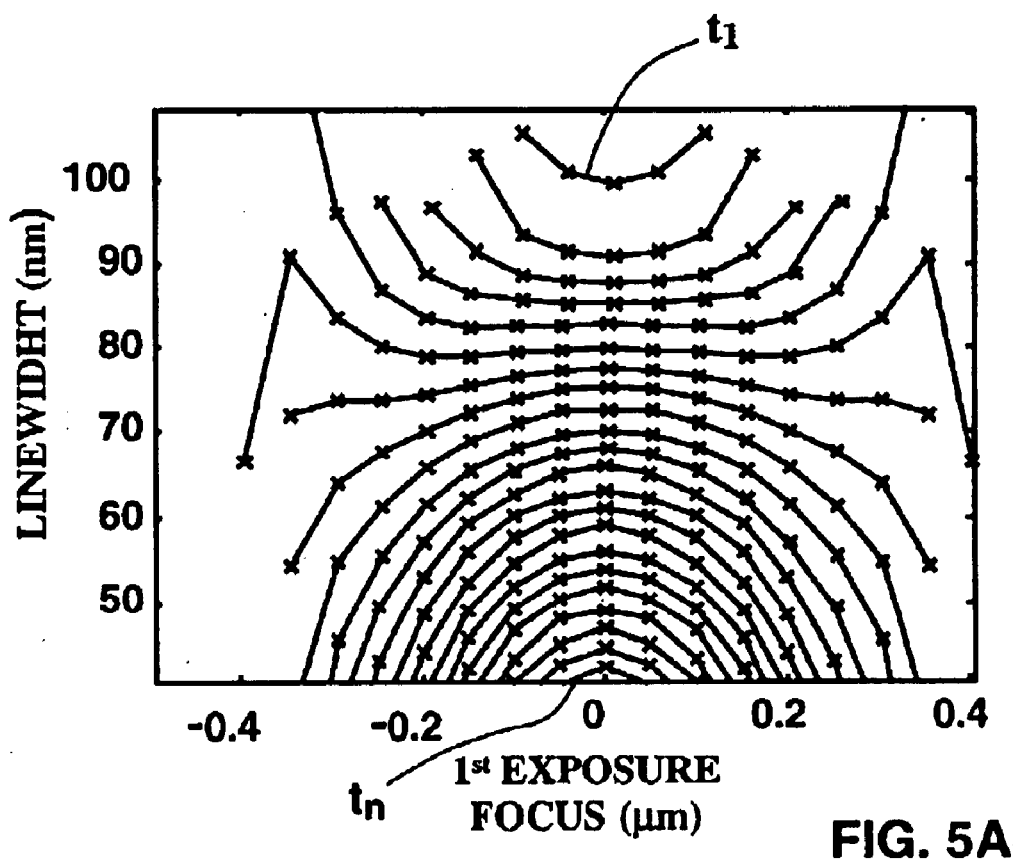
FIG. 5A is a Focus-Exposure Matrix (FEM) of linewidth as a function of defocus from the first exposure process.

Using a selected one of the composite images highlighted by the symbol HC illustrated in FIG. 4C, FIG. 4D illustrates how threshold $CD_1, \ldots, CD_n$ can be estimated for corresponding threshold dose values $t_1, \ldots, t_n$ respectively. The threshold CD values can be estimated for a range of threshold dose values for each composite image curve at all 1st exposure defocus values, and plotted as a function of first exposure focus $F1_i$ as illustrated in FIG. 5A, in which linewidth or threshold CD is plotted along curves of constant threshold dose $t_1, \ldots, t_n$. The curves illustrated in FIG. 5A are the generated composite FEM curves, which are similar to standard Bossung curves which are typically fitted to experimental FEM data.

Figure 6:
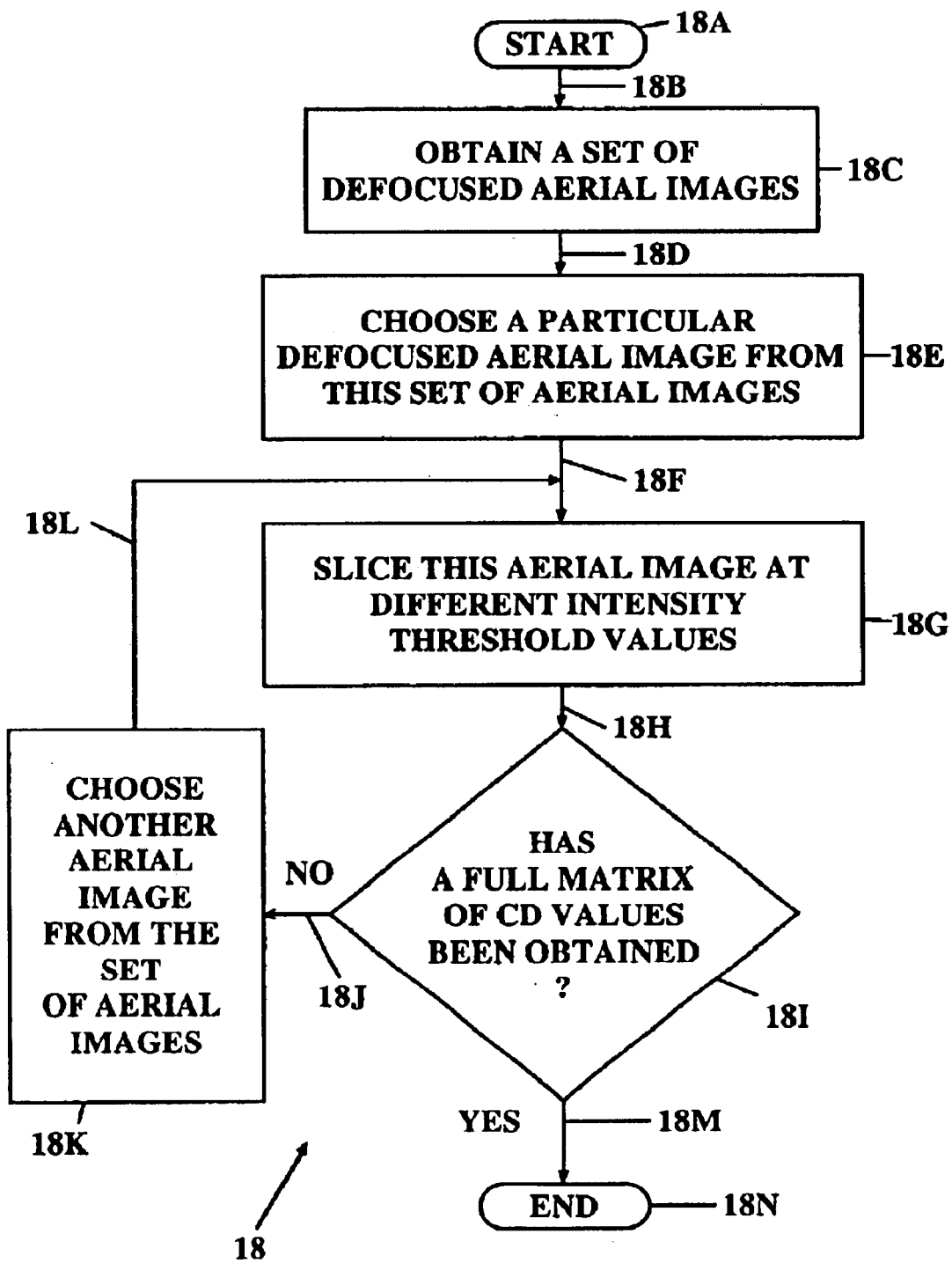
FIG. 6 is a flowchart showing the steps involved in obtaining the CD vs. focus curves in the flowchart in block 18 of FIG. 3.

FIG. 6 is an example of a more detailed flowchart of the steps involved in obtaining the CD vs. focus curves of FIG. 5A for Block 18 in the flowchart of FIG. 3. This set of steps 18A–18N may include a few more or less steps depending what kind of resist model is used for calculating the CD as will be well understood by those skilled in the art.

From step 18C the flowchart proceeds along line 18D to step 18E in which the system chooses a particular defocused image from the set of aerial images obtained in step 18C. The analysis is made based upon the assumption that the highlighted curve HC in FIG. 4C is the current particular defocused image that has been chosen.

From step 18E, the flowchart proceeds along line 18F to step 18G in which the system "slices" the aerial image chosen at a plurality of different intensity threshold dose values as illustrated by FIG. 4D that is a graph of intensity vs. position showing curve HC which was selected from the group of curves shown in FIG. 4C. Curve HC is being sliced from threshold value $t_1$ to threshold value $t_n$. The "slicing" is done by choosing several intensity values, that are inclusive in the intensity profile, and for each intensity value, measure the distance between the intersection points where such intensity value crosses the intensity profile curve. For every "slice" the resulting threshold CD is recorded, as illustrated by FIG. 4D.

From step 18G, the flowchart proceeds along line 18H to step 18I where the system tests to determine whether results obtained to that point include a full matrix of CD values of the width of the object to be printed, e.g. a bar such as a gate electrode of an FET transistor, as a function of defocus and intensity threshold.

If the test in step 18I produces a NO answer, then the flowchart proceeds along line 18J to step 18K in which another aerial image is chosen from the set of aerial images and the flowchart proceeds along line 18L to line 18F to repeat step 18G in recursive iterations.

In that case, step 18G is repeated in recursive iterations until a full matrix of CD values as a function of defocus and intensity threshold is obtained as indicated by the test in block 18I in the flowchart in FIG. 6.

FIG. 5A shows a Focus-Exposure Matrix (FEM) which is a plot of linewidth as a function of focus and dose values. FIG. 5A is a graphical representation of the result of step 18I when it yields a "YES". The resulting linewidths after iterating upon choosing specific defocussed aerial images and "slicing" such aerial images, as described in steps 18E and 18G, are plotted for illustration purposes.

Then, if the answer to the test in block 18I is YES, the flowchart proceeds along line 18L to the END block 18M, signifying the end of the program defined by the flowchart of FIG. 6.

The resulting full matrix of CD values produced by the system can then be used to calculate the lithographic process performance, that is commonly known as the process window. (The process window function ($f_{pw}$) is described hereinabove.)

Process Window Response Surface

Referring again to FIG. 3, in step 20, using the resist pattern characteristics (e.g. CD values) resulting from the composite images, process window metric values can be determined. In a typical single exposure process, process window can be determined based on experimental FEM data. Process window metric values can be determined as a function of exposure latitude and depth of focus. These experimentally determined process window metric values can be used to obtain a functional form for a process window model, for example, by applying standard curve fitting techniques. Such a process window function may be referred to as a process window response surface.

In accordance with the present invention, composite process window metric values as a function of dose-ratio and defocus are determined by first using the set of composite images (FINALSET) at a given second exposure defocus and dose-ratio value, and used to generate a composite process window value based on all first exposure images (i.e., $IMAGEC_{i,j,m}$), for all first exposure focus values $F1_i$, for i=1, . . . ,I, at fixed $F2_j$ and fixed dose-ratio $R_{Am}$). The composite response surface is preferably generated by using curve fitting techniques or other appropriate means, such as a table look-up, or may be computed directly from the aerial image simulation models using the composite weighting factor in accordance with the present invention.

The preferred metric values are as follows:
 a. Integrated area under the exposure latitude vs. depth-of-focus (DOF) curve (%-μm); or
 b. A calculated depth-of-focus value at some given exposure latitude percentage value (μm).

The choice of metrics employed is not limited to these preferred metrics, but it should be chosen to represent the process capability of the lithographic scenario under evaluation.

Figure 5B:
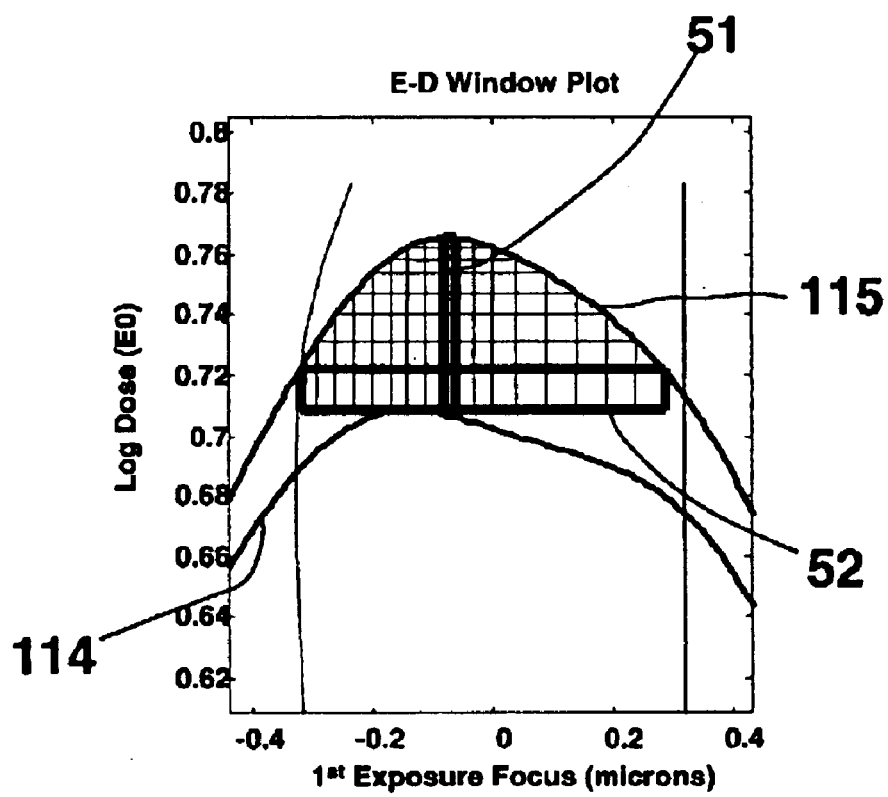
FIG. 5B illustrates a focus-dose plot in which an acceptable process window is defined.
Figure 5C:
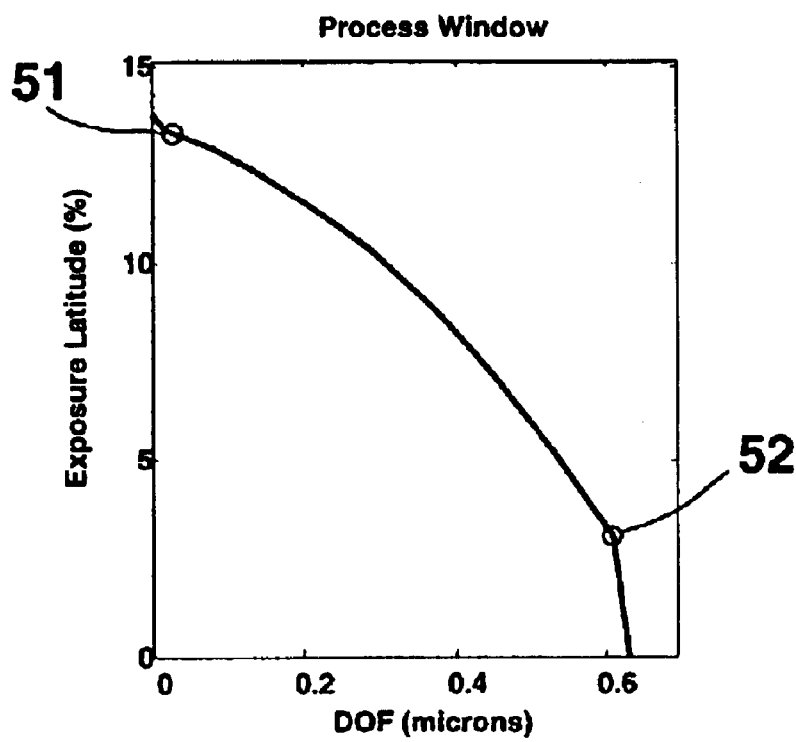
FIG. 5C illustrates a plot of exposure latitude as a function of depth-of-focus.

The integrated area (%-μm) under an exposure latitude vs. DOF curve is illustrated in FIGS. 5A through 5C. FIG. 5B illustrates a dose-focus process window plot which could be derived from the linewidth vs. focus-dose plot such as the one in FIG. 5A. In these example plots, dose refers to the threshold dose used to estimate CD (as illustrated in FIG. 4D). In FIG. 5B, the upper curve 115 is the upper bound of CD tolerance, while the lower curve 114 is the lower bound of CD tolerance. The area between the upper bound 115 and the lower bound 114 defines the acceptable process window. Typically, this information is expressed in terms of exposure latitude as a function of depth-of-focus (DOF). For example, the wide rectangular region 52 represents the maximum range of focus or DOF that fits within the acceptable process window. At this fixed DOF, the maximum range of dose values, or exposure latitude, is represented by the height of the wide rectangular region 52. Note that in FIG. 5B, for convenience, the dose is plotted on a log scale. However, for the purposes of computing exposure dose latitude, a linear scale would be used. This value is plotted in FIG. 5C as corresponding point 52 as a function of DOF and exposure latitude, where exposure latitude is ratio of the height (the range of dose on a linear scale) of the wide rectangle 52 to the value of dose (on a linear scale) at the midpoint of the rectangle 52, expressed as a percentage. Similarly, the narrow rectangle 51 represents a condition where a large exposure (or dose) latitude might be desired, but for which only a small DOF will be tolerated to ensure that the patterns are printed within tolerance and stays within the acceptable process window. This condition is plotted as point 51 in FIG. 5C. Thus, the area under the exposure latitude—DOF curve provides one metric of usable process window.

Figure 7:
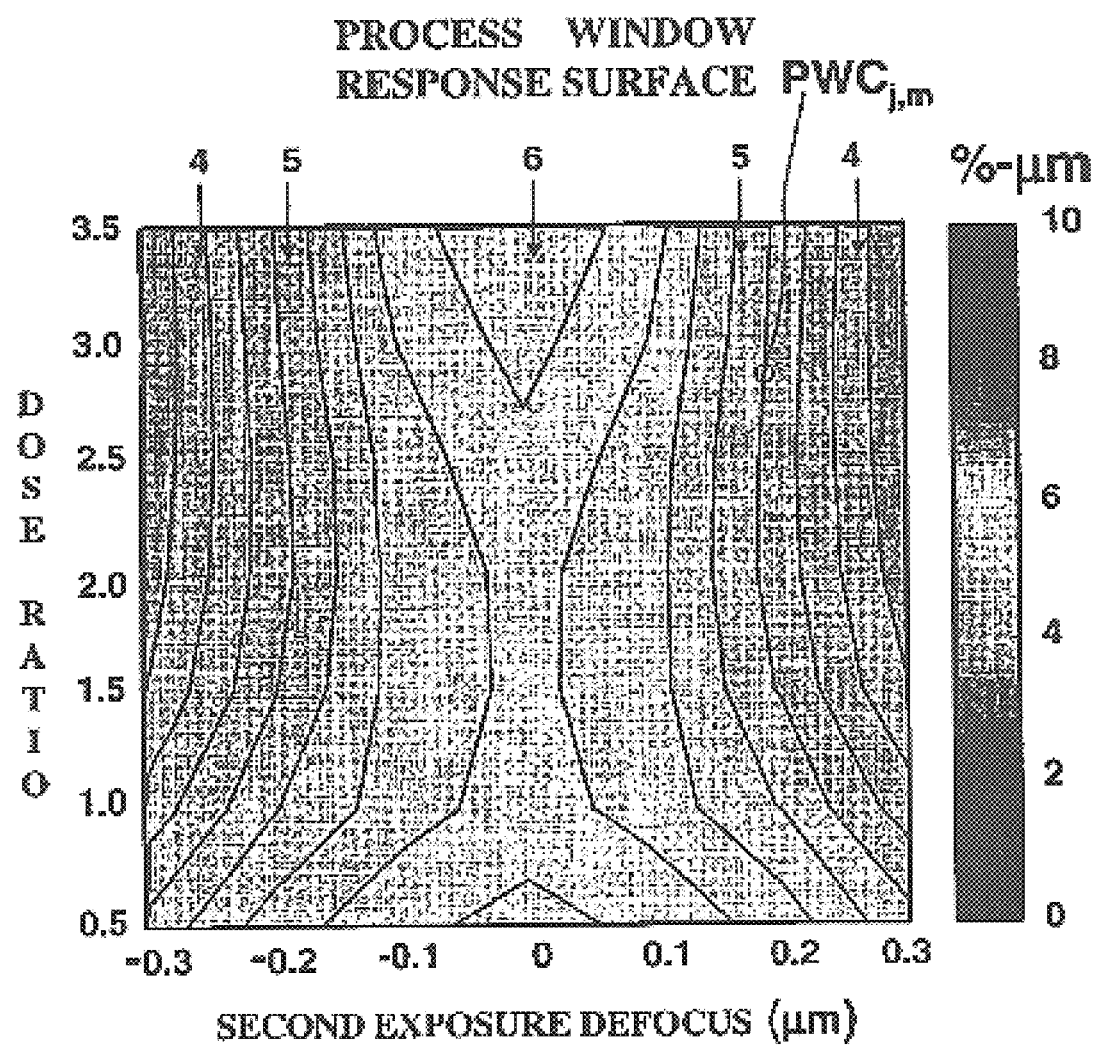
FIG. 7 shows a composite process window response surface mapped out as a function of "Dose-Ratio" and "Second Exposure Defocus".

In accordance with the present invention, a value of a Composite Response is generated by computing a process window metric based on composite images for all first exposure focus values at a given second exposure focus and dose-ratio. In this embodiment the process window metric used is the metric of %-μm, obtained in this example by computing the area under an exposure latitude vs. DOF curve at a given second exposure focus $F2_j$ and dose-ratio $R_{Am}$, based on the composite image curves $IMAGEC_{i,j,m}$ for i=1, . . . , I. This provides one composite process window value $PWC_{j,m}$, which is used in generating a composite process window response surface function, as illustrated in FIG. 7. In the case of three or more exposures, additional parameters may be added, which can result in a response surface having multiple dimensions greater than three.

In step 22, the system determines whether an adequate (e.g., whether a sufficient range of second exposure defocus and dose-ratio values have been sampled) composite response surface has been obtained. If NO, the system returns as indicated by line 30 through block 32 to block 14. Block 32 increments the value of N to N+1 as indicated in TABLE I above. This value is introduced to step 14 which repeats the process from steps 14–22 until the test in step 22 yields the YES answer as to whether an adequate response surface has been obtained which may be after all values of N have been exhausted by block 32. Thus, steps 14, 16, 18, 20 and 22 are repeated for different values of second exposure defocus and dose ratio (or second exposure dose) until an adequate response surface is obtained, that is, when a sufficiently large range of second exposure defocus and dose errors have been included. When the answer in step 22 is YES, the system 40 progresses along line 23.

III. Applications of the Composite Process Window

In accordance with the present invention, the composite process window response surface can be used to predict yields expected for a given multiple exposure process if the defocus and dose error budgets are known. Error budgets are the ranges of known defocus and dose errors that are characteristic of the tools to be used in the lithographic process. In this example, the composite response surface may be considered adequate when the values for second exposure defocus and exposure dose include at least the range of typical defocus and dose error budgets for the second exposure. From the known defocus and dose error distributions, an estimate of yield for the multiple exposure process can be determined, for example, by using a Monte Carlo analysis, as described in more detail as follows.

For example, a composite process window response surface is generated in accordance with the present invention as illustrated by the chart of FIG. 7. For this response surface, the process window is mapped out as a function of two variables, namely "Dose-Ratio" and "Second Exposure Defocus". Notice that the values for Dose-Ratio are from 0.5 to 3.5 and that the values for Second Exposure Defocus are from −0.3 to 0.3. In this example, it is assumed that the tool dose and defocus errors (i.e., the inputs to the Monte Carlo analysis) are two gaussian distributions corresponding to a mean value of 2 with a standard deviation ($1\sigma$) of 0.05 for the dose-ratios errors and a mean value of 0 μm with a standard deviation of 0.03 μm for the defocus errors. The composite response surface is deemed adequate if most (3 $\sigma$) of the defocus and dose errors fall inside the response surface's independent variables' ranges. So, for this example, we have the following:

Dose-ratio range: 0.5 to 3.5 (i.e. solution space for dose-ratio on response surface)

Defocus range: −0.3 μm to 0.3 μm (i.e. solution space for second exposure focus on response surface)

Range of assumed dose-ratio=mean ±3σ=1.85 to 2.15 (2^±0.15)

Range of assumed defocus=mean ±3σ=−0.09 μm to +0.09 μm (0 μm ±0.09 μm,

Given the sampling ranges one can conclude that this response surface passes the adequacy test. The adequacy test is passed if the range of assumed focus and dose-ratio errors are included in the solution spaces of the response surface as described above. If the range of assumed dose-ratio errors had been from 0.1 to 5, then this response surface would have been inadequate for the analysis under evaluation.

Given the error distributions (so-called error budgets of the available tools), expected composite process window values are generated for a range of dose and defocus errors, for example, by a Monte Carlo analysis in Block 24 of FIG. 3. FIG. 8A illustrates a composite process window response surface for the dual exposure process for altPSM mask 8 and Trim mask 9, generated in accordance with the present invention. Using the error budgets for focus and dose ratio errors as discussed above, a Monte Carlo analysis would generate focus errors as in FIG. 8B and dose ratio errors as in FIG. 8C. Applying these focus and dose ratio errors to the composite response surface of FIG. 8A, the Monte Carlo simulation will generate a distribution of composite (double exposure, in this example) process window values.

Next follows an analysis of the distribution either by the processor along line 25' to step 26 which leads along line 27 to the end of the process at block 28 or by an analysis by the technical expert based upon the process window distribution presented on the monitor DD or the graphics printer GR in which case the process progresses directly along through line 25 to the end of the process at block 28. This may consist of looking at the range or spread of the distribution given some mean target process window value.

Figure 10:
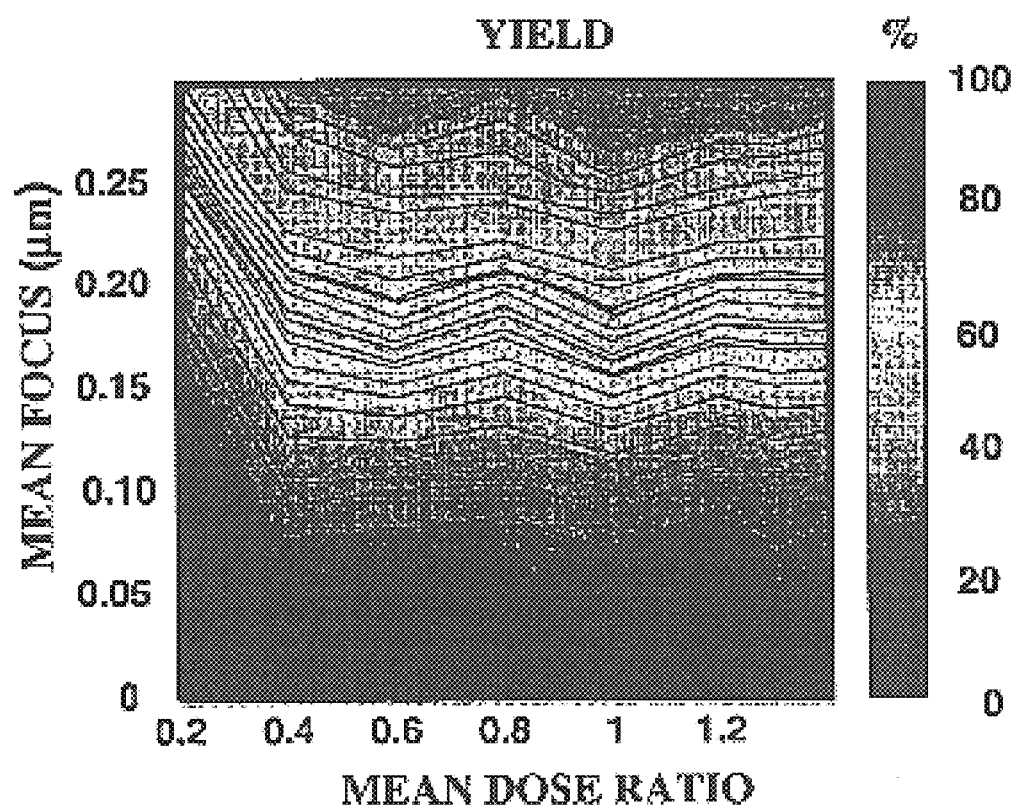
FIGS. 10, 11 and 12 illustrate estimates of yield resulting from analysis of the composite process window distribution determined in FIG. 8D in accordance with this invention.
Figure 11:
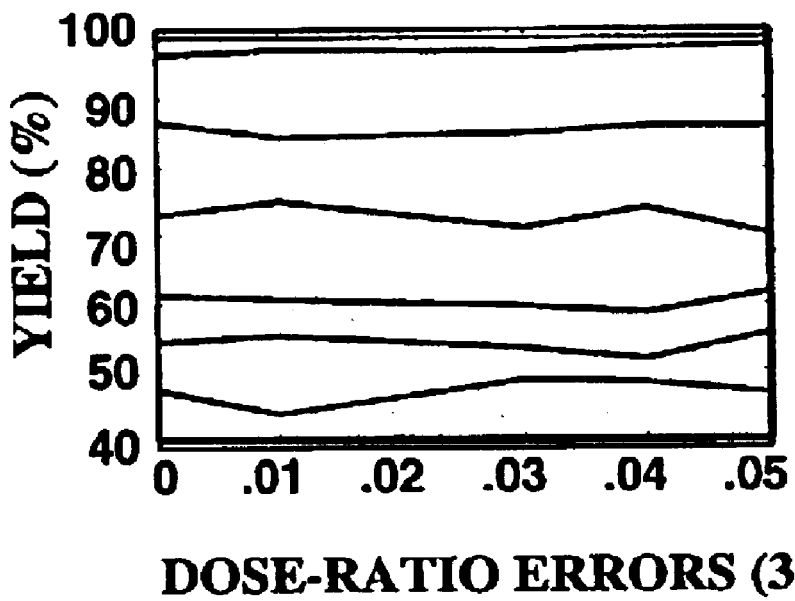
Figure 12:
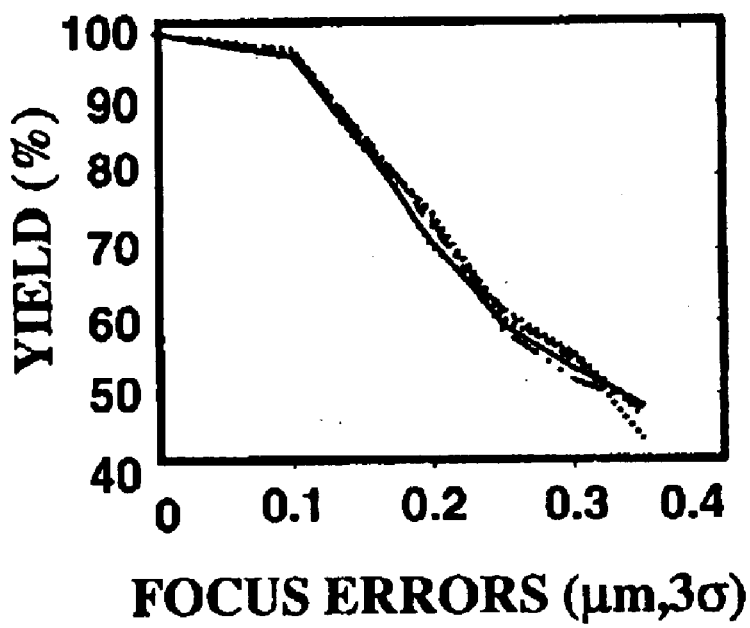

FIGS. 10, 11, and 12 show three different ways to represent a typical lithographic performance analysis with this invention. In most cases, lithographers are interested in determining how well a specific lithography process performs by calculating its yield, which is typically a measure of number of many chips out of the total number of chips in a full wafer meet or exceed specifications.

For the purpose of this invention and to provide a metric for analysis, yield may be expressed as the area of the histogram of the composite process window distribution (as shown in FIG. 8D) that exceeds or is equal to a specified process window target. For example, the total area of the composite process window distribution histogram (i.e. the total number of exposure conditions) is representative of the total number of chips on a wafer. A minimum target process window value represents the minimum process conditions that ensure pattern characteristics (e.g. CD variations) are within tolerance, for example, a target value of at least 10%-μm is required to ensure CD values within tolerance. Using the distribution as shown in FIG. 8D, the area of the histogram that is equal to or exceeds the 10%-μm target represents the number of exposure conditions (or chips) that would provide adequate CD. The ratio of this area out of the total area of the histogram is representative of the yield to be expected for the dual exposure lithographic process of the present example, for given dose and focus error budgets.

FIG. 10 shows the predicted yield (expressed as a percentage) as a function of the mean focus and the mean dose errors for a specific lithography process.

FIGS. 11 and 12 show the same data as in FIG. 10 only represented as line plots instead of a contour map. Based on the data in FIGS. 10, 11 and 12, different lithography processes can be evaluated.

It is also possible to use the method of this invention for process control of a multiple exposure operation by optimizing the focus and dose conditions for the individual exposures of each step. Alternatively, given a target yield, the composite process window of the present invention may be used to determine the tool specifications for dose error and defocus error budgets required to achieve the desired target yields for the multiple exposure process.

This method is adapted for inclusion in lithography solutions software packages.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of evaluating effects of a multiple exposure photolithographic process, the method comprising:
   providing a first exposure process;
   determining a first plurality of images based on said first exposure process, wherein said first plurality of images are formed over a first range of first exposure conditions;
   providing a second exposure process;
   determining a second plurality of images based on said second exposure process, wherein said second plurality of images are formed over a second range of second exposure conditions;
   determining a third plurality of images, wherein each of said third plurality of images comprises one of said first plurality of images perturbed by one of said second plurality of images weighted by a weighting factor; and
   using said third plurality of images to evaluate effects of applying said first exposure process and said second exposure process in sequence.

2. The method of claim 1 wherein said first plurality of images are normalized to a first maximum intensity and said second plurality of images are normalized to a second maximum intensity.

3. The method of claim 2 wherein said first range of exposure conditions comprises a first range of defocus and said second range of exposure conditions comprises a second range of defocus conditions, and said weighting factor comprises a ratio of a second dose of said second exposure conditions to a first dose of said first exposure conditions (DOSE-RATIO).

4. The method of claim 1 further comprising determining a composite process window metric (PWC) based on said third plurality of images, wherein said composite process window metric comprises a function of said first and second exposure conditions.

5. The method of claim 4 wherein said first range of exposure conditions comprises a first range of defocus and said second range of exposure conditions comprises a second range of defocus conditions and wherein said determining a PWC further comprises providing a range of threshold resist doses and determining a range of critical dimension (CD) values based on said third plurality of images wherein each of said CD values corresponds to one of said range of threshold resist doses for one of said third plurality of images.

6. The method of claim 4 further comprising:
   providing an error budget distribution for said first and second exposure conditions;
   determining a PWC distribution of said PWC based on said error budget distribution; and
   determining a yield based on said PWC distribution.

7. The method of claim 4 wherein said determining a PWC further comprises:
   providing a selected one of said second exposure conditions;
   determining a selected one of said second plurality of images corresponding to said selected one of said second exposure conditions;
   determining a subset of said third plurality of images, wherein said subset comprises said first plurality of images perturbed by said selected one of said second plurality of images weighted by said weighting factor; and
   determining a PWC value corresponding to said Selected one of said second exposure conditions based on said third plurality of images over said first range of said first exposure conditions.

8. The method of claim 7 further comprising determining said PWC values over said second range of said exposure conditions to form a PWC response matrix.

9. The method of claim 7 wherein said first range of exposure conditions comprises a first range of defocus and said second range of exposure conditions comprises a second range of defocus conditions and wherein said determining a PWC further comprises providing a range of threshold resist doses and determining a range of critical dimension (CD) values based on said third plurality of images wherein each of said CD values corresponds to one of said range of threshold resist doses for one said third plurality of images.

10. The method of claim 4 further comprising:
   providing a target yield;
   determining a PWC distribution of said PWC based on said error budget distribution; and
   determining an error budget distribution so that said target yield is obtained from said PWC distribution.

11. A computer program product for evaluating a multiple exposure lithographic process comprising:
   computer readable code for causing a computer to:
   store a first exposure process;
   determine a first plurality of images based on said first exposure process, wherein said first plurality of images are formed over a first range of first exposure conditions;
   store a second exposure process;
   determine a second plurality of images based on said second exposure process, wherein said second plurality of images are formed over a second range of second exposure conditions;
   determine a third plurality of images, wherein each of said third plurality of images comprises one of said first plurality of images perturbed by a weighted one of said second plurality of images; and
   provide said third plurality of images for evaluating effects of applying said first exposure process and said second exposure process in sequence.

12. The computer program product of claim 11 wherein said first plurality of images are normalized to a first maximum intensity and said second plurality of images are normalized to a second maximum intensity.

13. The computer program product claim 12 wherein said first range of exposure conditions comprises a first range of defocus and said second range of exposure conditions comprises a second range of defocus conditions, and said weighting factor comprises a ratio of a second dose of said second exposure conditions to a first dose of said first exposure conditions (DOSE-RATIO).

14. The computer program product of claim 11 further comprising computer readable code for causing a computer to determine a composite process window metric (PWC) based on said third plurality of images, wherein said composite process window metric comprises a function of said first and second exposure conditions.

15. The computer program product of claim 14 wherein; said first range of exposure conditions comprises a first range of defocus and said second range of exposure conditions comprises a second range of defocus conditions and wherein said computer readable code for causing a computer to determine a PWC further comprises computer readable code for causing a computer to store a range of threshold resist doses and determine a range of critical dimension (CD) values based on said third plurality of images wherein each of said CD values corresponds to one of said range of threshold resist doses for one of said third plurality of images.

16. The computer program product of claim 14 further comprising computer readable code for causing a computer to:
   store an error budget distribution for said first and second exposure conditions;
   determine a PWC distribution of said PWC based on said error budget distribution; and
   determine a yield based on said PWC distribution.

17. The computer program product of claim 14 wherein said computer readable code for causing a computer to determine a PWC further comprises computer readable code for causing a computer to:
   store a selected one of said second exposure conditions;
   determine a selected one of said second plurality of images corresponding to said selected one of said second exposure conditions;
   determine a subset of said third plurality of images, wherein said subset comprises said first plurality of images perturbed by said selected one of said second plurality of images weighted by said weighting factor; and
   determine a PWC value corresponding to said selected one of said second exposure conditions based on said third plurality of images over said first range of said first exposure conditions.

18. The computer program product of claim 17 further comprising computer readable code for causing a computer to determine said PWC values over said second range of said exposure conditions to form a PWC response matrix.

19. The computer program product of claim 17 wherein:
   said first range of exposure conditions comprises a first range of defocus and said second range of exposure conditions comprises a second range of defocus conditions and;
   wherein said computer readable code for causing a computer to determine a PWC further comprises computer readable code for causing a computer to store a range of threshold resist doses and determine a range of critical dimension (CD) values based on said third plurality of images wherein each of said CD values corresponds to one of said range of threshold resist doses for one said third plurality of images.

20. The computer program product of claim 14 further comprising computer readable code for causing a computer to:
   store a target yield;
   determine a PWC distribution of said PWC based on said error budget distribution; and
   determine an error budget distribution so that said target yield is obtained from said PWC distribution.

* * * * *